United States Patent [19]

Michel et al.

[11] Patent Number: 4,884,115
[45] Date of Patent: Nov. 28, 1989

[54] BASIC CELL FOR A GATE ARRAY ARRANGEMENT IN CMOS TECHNOLOGY

[75] Inventors: Petra Michel, Grafing; Martin Geiger, Furth, both of Fed. Rep. of Germany

[73] Assignee: Siemens Aktiengesellschaft, Berlin and Munich

[21] Appl. No.: 152,234

[22] Filed: Feb. 4, 1988

[30] Foreign Application Priority Data

Feb. 27, 1987 [DE] Fed. Rep. of Germany ....... 3706462

[51] Int. Cl.[4] ..................... H01L 27/02; H01L 27/10; H01L 27/15
[52] U.S. Cl. ......................... 357/42; 357/45
[58] Field of Search ..................... 357/42, 45 M, 45 L

[56] References Cited

U.S. PATENT DOCUMENTS

| | | | |
|---|---|---|---|
| 4,562,453 | 12/1985 | Noguchi et al. | 357/45 |
| 4,668,972 | 5/1987 | Sato et al. | 357/45 |
| 4,740,827 | 4/1988 | Niitsu et al. | 357/42 |

FOREIGN PATENT DOCUMENTS

| | | | |
|---|---|---|---|
| 0119059 | 9/1984 | European Pat. Off. | |
| 0130365 | 1/1985 | European Pat. Off. | 357/45 M |
| 3238311 | 4/1984 | Fed. Rep. of Germany | |
| 0061047 | 4/1984 | Japan | 357/45 M |
| 59-163837 | 9/1984 | Japan | |
| 0113943 | 6/1985 | Japan | 357/45 M |
| 0187249 | 8/1986 | Japan | 357/45 M |

OTHER PUBLICATIONS

Nakaya et al. "High Speed MOS Gate Array" IEEE Transactions on Electron Devices vol. ED-27 No. 8 Aug. 1980.
*Electronics & Communications in Japan,* "Design of CMOS Masterslide Logic LSI", Vol. 66, Jan. 1983, pp. 111-119.
Hitachi Review, "Development of Hybrid Gate Array", Vo. 33, 1984, pp. 261-266.

*Primary Examiner*—Eugene R. LaRoche
*Assistant Examiner*—Michael B. Shingleton
*Attorney, Agent, or Firm*—Hill, Van Santen, Steadman & Simpson

[57] ABSTRACT

A gate array arrangement provides basic cells in a core region, with logic functions or storage functions being realized by wiring these basic cells. The basic cells are composed of six or seven transistors in CMOS technology, with three p-channel transistors (TR1) in a a first region (BE1) and three n-channel transistors (TR2) in a second region (BE2), with the terminals (GTA) of the gate electrodes (GT1, GT2) of the transistors being arranged between these two regions (BE1, BE2). A further transistor (TR3) that has a smaller channel width than the remaining transistors (TR1, TR2) is arranged outside of the region (BE2) for the n-channel transistors (TR2). The gate electrode (GT3) of the further transistor lies parallel to the electrodes (GT2) connected to the gates of the n-channel transistors (TR2) but is shorter. The terminal (GTB) of the gate electrode (GT3) of the further transistor (TR3) faces toward the line for the supply voltage (VSS). The terminals (GTA) of the gate electrodes of the n-channel and p-channel transistors lie next to one another and can thus be connected to one another by the shortest possible path, and adequate space is available over the regions (BE1, BE2) to conduct wiring lines above the cell.

12 Claims, 4 Drawing Sheets

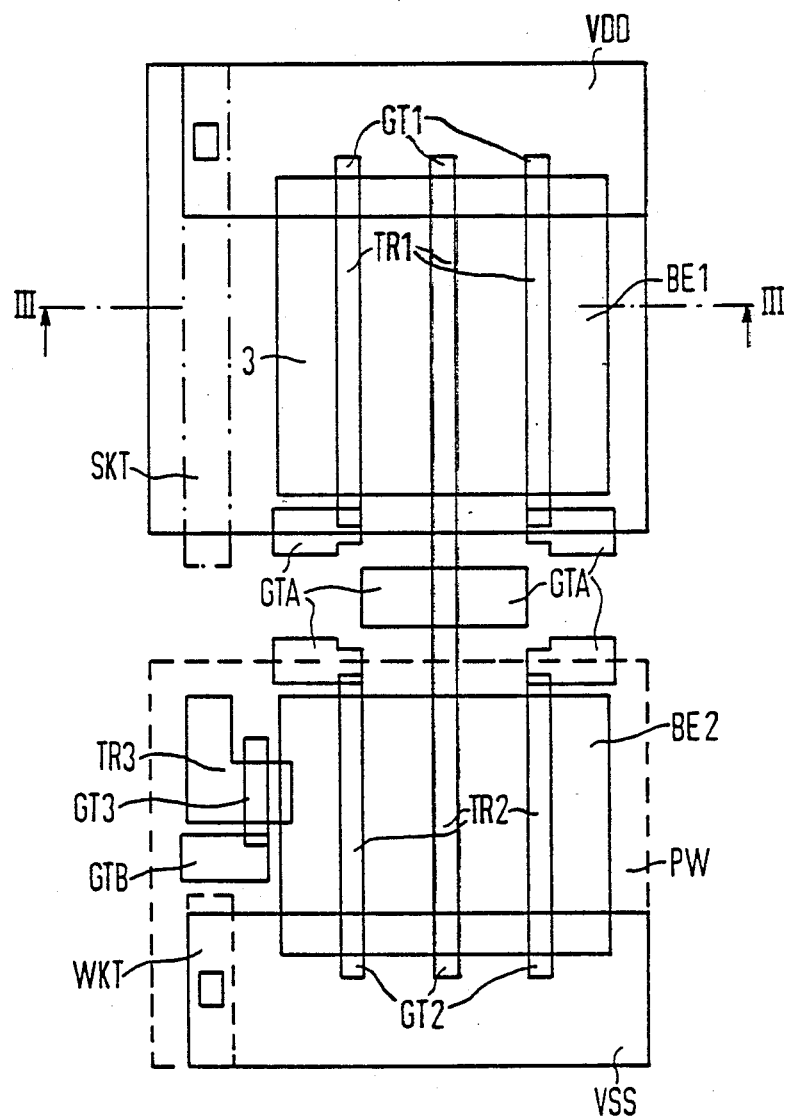

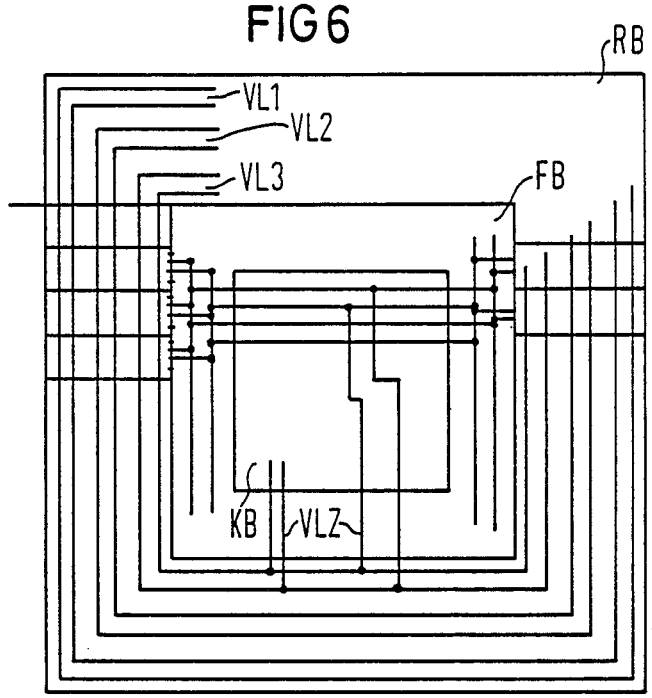

BASIC CELL FOR A GATE ARRAY ARRANGEMENT IN CMOS TECHNOLOGY

BACKGROUND OF THE INVENTION

The invention is directed to a basic cell for a gate array arrangement in CMOS technology, in which first transistors of one conductivity type lie behind one another in a first region, and an identical number of second transistors of the other conductivity type lie behind one another in a second region arranged adjacent to said first region, with the electrodes of the transistors in the first region and the electrodes of the transistors in the second region respectively proceeding in one direction.

Gate array arrangements are known (for example, Hitachi Review, Vol. 33 (1984) No. 5, pages 261 through 266, European Patent No. 011 9059-A2). In such gate array arrangements, cell regions, or cells in a defined arrangement are provided on a chip. An example of such a gate array arrangement is shown in FIG. 1 and in FIG. 2 of European Patent No. 011 9059-A2. The basic cells are composed of n-channel and p-channel transistors which are arranged in the cell regions in a defined way. By connecting the n-channel and p-channel transistors per basic cell, the basic cell can be specified for the realization of a basic function, and it can be used, for example, to perform a logic function or a memory function. As described in the Hitachi Review, a basic cell can, for example, be composed of ten transistors that are connected to one another such as to produce a RAM memory cell having one input or two inputs. A logic function, for example, a NAND function can be realized by other connections of the transistors.

European Patent No. 011 9059-A2 yields basic cells composed of four transistors, respectively two p-channel and two n-channel transistors, and illustrates how logic functions can be realized by interconnecting the basic cells.

The individual basic cells in the gate array arrangement must be connected to one another for setting functions. This occurs via wiring channels which are either arranged between the rows of basic cells or proceed over the rows of basic cells.

The realization of memories having different capacities was hitherto achieved in various ways. Bistable circuits were used for storage structures having low capacity. These bistable circuits are composed of a plurality of gates and therefore require a relatively great number of basic cells of a gate array for storing an information unit. Memories having high capacity were realized by a memory block having a defined capacity and designed as a universal cell integrated into the core region of a chip. In this arrangement, the capacity of a memory can only be selected in steps of the memory capacity of this universal cell, also referred to as macrocell, and a plurality of different gate array masters had to be produced to provide memory areas of various size. Finally, the space requirement for such memories was relatively great since wiring channels had to be arranged between the rows of basic cells.

SUMMARY OF THE INVENTION

The object underlying the present invention is to specify a basic cell for a gate array arrangement in CMOS technology that is constructed such that memory functions can also be realized in addition to basic logic functions, so that it is possible to flexibly adapt the memory regions on a gate array arrangement to their respective needs.

In a basic cell of the species described above, this object is achieved by an arrangement in which the terminals for the gates of the transistors are located between the first and second regions, and two separate supply potentials are made available at the outer edges of the two regions.

The basic cell composed of three p-channel and three n-channel transistors that is realized in accord with the present invention has the advantage that the terminals for the gate electrodes lie in the middle region of the basic cell and, thus, space is present for wiring lines or wiring channels in the outer regions.

It is especially advantageous when the basic cell is composed of seven transistors, namely respectively three p-channel transistors and three n-channel transistors of the same channel width and of one n-channel transistor of a narrower channel width. Such a basic cell makes the realization of a memory cell possible that uses six transistors for the memory cell and the transistor having the low channel width for a selection transistor.

The use of such basic cells makes it possible to construct a gate array arrangement which provides basic cells in the core region, provides space for wiring channels around the core region of the basic cells, and provides an edge strip for edge cells and supply lines around the wiring channels. The supply lines are placed around the core region and are arranged above the edge cells lying in the edge strip. It is thus possible to achieve the connection between the supply lines and the edge cells over the shortest path and to connect the supply lines of the core region from two sides.

BRIEF DESCRIPTION OF THE DRAWINGS

The invention shall be set forth in greater detail with reference to exemplary embodiments that are shown in the figures, in which:

FIG. 2 shows a layout of a basic cell;

FIG. 6 shows the arrangement of the supply lines on the gate array.

DESCRIPTION OF THE PREFERRED EMBODIMENT

Figure 1:
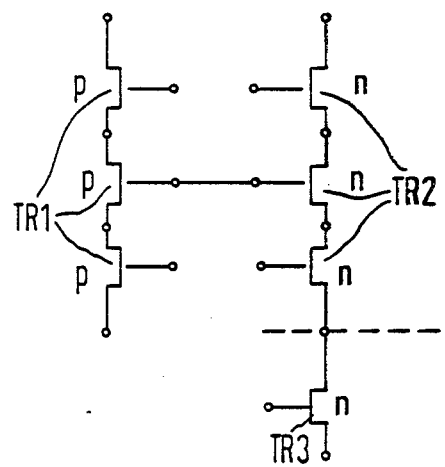
FIG. 1 shows a circuit diagram of a basic cell.

A circuit diagram of the basic cell is shown in FIG. 1. In a first embodiment, the basic cell is composed of six transistors, namely three p-channel transistors TR1 and three n-channel transistors TR2. The n-channel transistors and the p-channel transistors have their controlled paths respectively connected in series. The gate electrode of one p-channel transistor and of one n-channel transistor are connected to one another.

In a second exemplary embodiment, the basic cell is composed of seven transistors, namely three p-channel transistors TR1, three n-channel transistors TR2 and one further n-channel transistor TR3. The further n-channel transistor TR3 has its controlled path lying in series with the controlled paths of the other n-channel transistors TR2.

FIG. 2 shows the layout of the basic cell. The basic cell first contains a region BE1 in which the p-channel transistors TR1 are arranged, and a second region BE2 in which the n-channel transistors are arranged. The p-channel transistors TR1 are arranged relative to one another such that they lie following one another in accord with FIG. 1. The gate electrodes GT1 proceed parallel to one another. The analogous case applies for the n-channel transistors in the region BE2. Here, the gate electrodes GT2 proceed parallel to one another. The region BE1 for the p-channel transistors TR1 and the region BE2 for the n-channel transistors TR2 are arranged beside one another such that the electrodes are parallel and respectively proceed in one direction. The terminals GTA of the gate electrodes GT1 and GT2 are thereby arranged between the regions BE1 and BE2 or lie in the edges of the regions BE1 and BE2 which face toward one another. This arrangement of the terminals GTA for the gate electrodes GT1, GT2 has the advantage that the connections between the gate electrodes are made on the shortest path; further, a large part of the regions BE1, BE2 remains free of terminals for the gate electrodes and, thus, space for wiring channels above the basic cell is present.

Lines for the supply potentials VDD and VSS are arranged at those edges of the regions BE1 and BE2 facing away from another. A respective substrate contact SKT that is connected to the potential VDD and a respective well contact WKT is connected to VSS. Finally, the p-well PW for the n-channel transistors TR2 is also indicated in FIG. 2.

In accord with FIG. 2, the basic cell composed of three p-channel and three n-channel transistors set forth up to now can be expanded by a further n-channel transistor TR3. This n-channel transistor TR3 lies outside of the region BE2 for the n-channel transistors TR2. In comparison to the transistors TR2 in the region BE2, it lies such that its gate electrode GT3 and the terminal GTB for the gate electrode GT3 are arranged close to the line for the potential VSS. A connection to the potential VSS over the shortest path is thus possible, this then frequently occurring when only six transistors per basic cell are required for the realization of a function. The transistor TR3 can then be shut down. Space for wiring channels over the region BE2 continues to be present due to the arrangement of the further transistor TR3 relative to the transistors TR2.

It may be seen from FIG. 2 that the channel widths of the p-channel transistors with gate electrodes TR1 and of the n-channel transistors with gate electrodes TR2 are greater than the channel width of the further n-channel transistor TR3. A significant advantage of this arrangement is that memory cells composed of seven transistors can be realized with it, but the area required for the basic cell is not enlarged due to the seventh transistor TR3.

Figure 3:
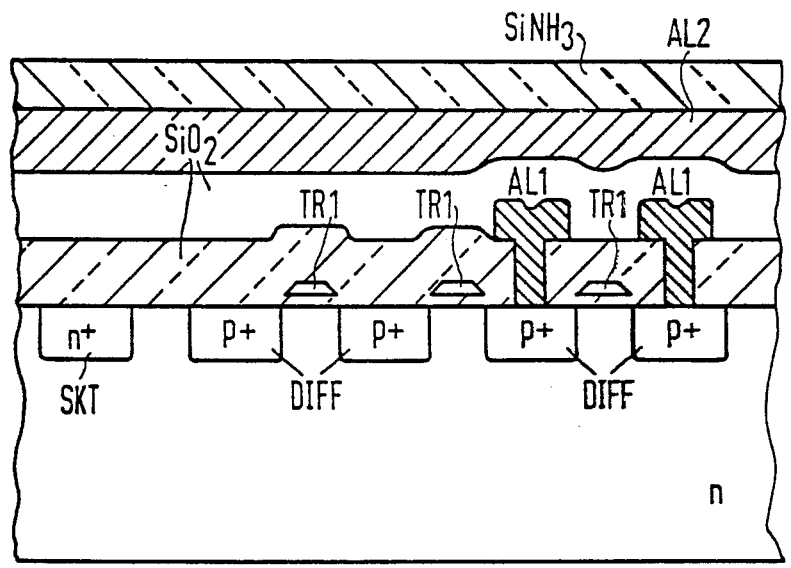
FIG. 3 illustrates a section through a basic cell.

FIG. 3 shows a section through the basic cell at the location III—III. Diffusion regions DIFF for the p-channel transistors are arranged in an n-substrate. The gate electrodes of the p-channel transistors lie in the oxide $SiO_2$. Two diffusion regions DIFF are each connected to a line of aluminum AL1 in order to connect source or drain of a transistor. Further, it is also shown by way of example how a second interconnect line AL2 of aluminum can be arranged above an insulating plane $SiO_2$. A layer of $SiNH_3$ can be placed above the whole for insulation. The format shown in FIG. 3 is known and need not be explained in further detail.

Figure 4:
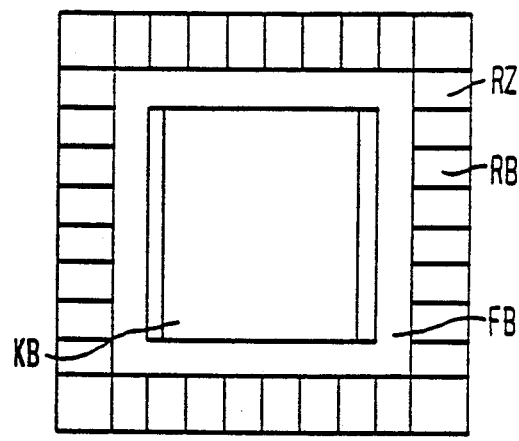
FIG. 4 shows a fundamental arrangement of the basic cells of a gate array.
Figure 5:
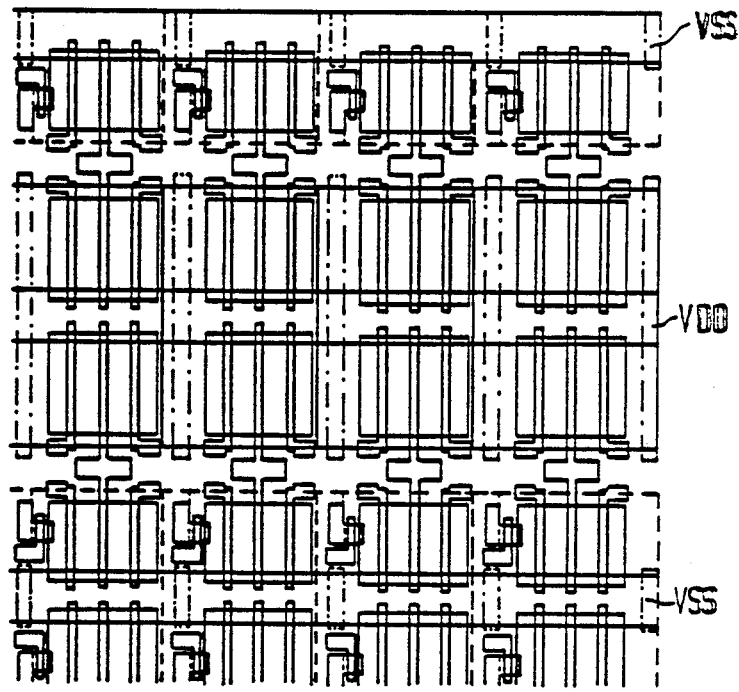
FIG. 5 shows a portion of the layout of a gate array.

A gate array arrangement using the basic cells of FIG. 2 is shown in FIG. 4. The basic cells are arranged in a core region KB. FIG. 5 shows a possible layout of this core region KB. A region FB in which wiring channels can be arranged is placed around the core region KB of basic cells. This region FB can be used for connecting the driver circuits in the edge region RB and the logic functions in the core region or, respectively, for bonding the supply lines in the core region KB. Finally, an edge region RB in which edge cells RZ are arranged lies around the region FB for the channels. The edge cells RZ can contain driver circuits or connector circuits.

The arrangement of the basic cells of FIG. 5 is such that a matrix of rows of basic cells and columns of basic cells arises. As a result of the mirror-image arrangement of the basic cells, two respective basic cell rows are supplied by one VDD or VSS supply line. The wiring of the basic cells is connected either across the cells, or by using a basic cell row as wiring channel, whereby this row can then not be used for the realization of a function. The wiring is not shown in FIG. 5.

FIG. 6 shows the arrangement of the supply lines relative to the individual regions of the gate array arrangement of FIG. 4. Supply lines VL for the supply potential VDD or VSS lie in the edge region RB. These supply lines VL are placed around the regions KB for the channels. Supply lines VL1 for the supply potentials VDD and VSS for the driver circuits in the edge cells RZ, supply lines VL2 for the supply potentials VDD and VSS for the remaining circuits in the edge region, and supply lines VL3 for the potentials VDD and VSS for the core region are provided. The annular arrangement of the supply lines over the edge cells RZ has the advantage that, in particular, the connections to terminals of the driver transistors in the edge cells are short. The wiring for setting the function in the edge cells is embodied in lines of metal, for example AL1, and the guidance of the supply lines over the edge cells is also accomplished by lines of metal, for example AL2. In addition to the signal terminals, the terminals for the supply lines of the core region KB are also located at the insides of the edge cells. Since there are more tracks or lines in the core region than terminals in the edge region, the horizontal lines of the core region (executed, for example, in AL1) are combined by vertical lines at the edge of the core region (executed, for example, in AL2). The supply lines of the core region are connected from two sides. As a result of the mirror-image arrangement of the basic cells, respectively two rows of basic cells are supplied by one VDD or VSS line. If further lines for supply potentials are required in the core region KB, then this can be carried out via vertically placed, additional supply lines VLZ.

The annular arrangement of the supply lines around the core region has the advantage that the connection of the supply lines in the core region KB to the supply lines in the edge region RB is made on the shortest path in the region FB for the wiring channels and no complicated line guidance is required in the channel region FB.

It will be apparent that various modifications and/or additions may be made in the apparatus of the invention without departing from the essential feature of novelty involved, which are intended to be defined and secured by the appended claims.

We claim:

1. A basic cell for a gate array arrangement in CMOS technology, including a first region containing a plurality of first transistors of one conductivity type connected in series, and a second region having an identical plurality of second transistors of the opposite conductivity from said one type connected in series, each of said transistors having a gate electrode, a drain electrode, and a source electrode, a plurality of first connecting lines respectively connected to said gate electrodes of said first transistors in said first region and a plurality of second connecting lines respectively connected to said gate electrodes of said second transistors in said second region, said first and second connecting lines being arranged in parallel with each other, (a) said first and second lines being connected respectively to a plurality of gate electrode contacts located between said first and second regions, said electrode contacts being located at different staggered positions along a direction parallel with said lines, one line of each of said first and second lines being connected in common to a single one of said gate electrode contacts, (b) a first supply conductor adapted to be connected to a first supply voltage positioned outside said first connecting lines at the outer edge of said first region proceeding in a direction parallel to said first series connected transistors, and (c) a second supply conductor adapted to be connected to a second supply voltage positioned outside said second connecting lines at the outer edge of said second region proceeding a direction parallel to said second series connected transistors.

2. The basic cell according to any of claim 1, including a substrate contact (SKT) provided outside of said first region proceeding parallel to the electrodes of said first transistors (TR1).

3. The basic cell according to any of claim 1, including a well contact (WKT) provided outside of said second region (BE2) proceeding parallel to the electrodes of said second transistors (TR2), said well contact projecting close to the gate terminal (GTP) of said third transistor (TR3).

4. The basic cell according to any of claims 1, 6 or 7, wherein said first transistors (TR1) are p-channel transistors, said second transistors (TR2) are n-channel transistors and said first and said second transistors have the same channel widths.

5. The basic cell according to any of claim 1, wherein said third transistor (TR3) is an n-channel transistor that has a smaller channel width in comparison to said first and said second transistors (TR1, TR2).

6. A basic cell according to claim 1, including a third transistor of said opposite conductivity type, said third transistor being located outside of said second region, said third transistor having source, drain and gate electrodes, the gate electrode of said third transistor being arranged in parallel to said second lines and having a length which is shorter than the length of said second lines.

7. The basic cell according to claim 6, including a gate contact connected to the gate electrode of said third transistor, and provided adjacent said second supply conductor.

8. The basic cell according to claim 11, including means for connecting a gate electrode contact of one of said first transistors to the gate electrode contact of one of said second transistors.

9. A gate array arrangement employing the basic cells according to any of claims 1, 6 or 7, said arrangement comprising (a) a core region of basic cells, said basic cells being arranged matrix-like in rows and columns, whereby two proximate rows of basic cells lie mirror-imaged relative to each other, and are connected to a common voltage supply line, (b) a channel region placed around said core region, said channel region including channel lines surrounding said core region and connected to the source and drain electrodes of said basic cells, and (c) an edge region located adjacent to said channel region on the opposite side from said core region, said edge region including edge cells and including terminals adapted to be connected to points exterior to said gate array arrangement, and a plurality of connecting lines connected to said terminals and to said channel lines.

10. The gate array arrangement according to claim 9 including supply lines located in said edge region and surrounding said core area, for two different supply voltages, said edge region including a plurality of driver circuits, and means for connecting said supply lines to said driver circuits.

11. A basic cell for a gate array arrangement constructed in CMOS technology, comprising, in combination:

a plurality of series-connected first transistors of one conductivity type, each having a drain electrode, a gate electrode and a source electrode, said first transistors being arranged successively in parallel with each other in a first region, an equal number of series-connected second transistors of the opposite conductivity from said one type, each having a source electrode, a gate electrode and a drain electrode, said second transistors being arranged successively in parallel to each other in a second region spaced from said first region, a first plurality of connecting lines interconnected with respective gate electrodes of said first transistors, a second plurality of connecting lines interconnected with respective gate electrodes of said second transistors, said first and second connecting lines being parallel to each other, a first gate contact connected to one of said first connecting lines, a second gate contact connected to one of said second connecting lines, said first and second gate contacts located in the space between said first and second regions and offset from each other whereby said first gate contact is closer than said second gate contact to said first region and said second gate contact is closer than said first gate contact to said second region, a first supply line adapted to be connected to a first supply voltage arranged at the outer edge of said first region and aligned in parallel to the direction of the series-connected first transistors, a second supply line for a second supply potential arranged at the outer edge of said second region, aligned in parallel to the direction of the series-connected second transistors, a substrate contact arranged adjacent to one side of said first region and aligned in parallel with the said first transistors, a well contact arranged adjacent to one side of said second region aligned in parallel to said second transistors, a third transistor of said opposite conductivity type adjacent to one side of said second region, said third transistor having drain, source and gate electrodes, the gate electrode of said third transistor being located in parallel to said second connecting lines but shorter than said second connecting lines, and including a third gate contact located between said third transistor and said well contact, said third gate contact being connected to the gate electrode of said third transistor.

12. The basic cell arrangement according to claim 11, wherein said third transistor has a diffusion region, the diffusion region of said third transistor and the third gate contact being located in alignment with the outer edge of said well contact, whereby said diffusion region for said third transistor and said third gate contact do not extend laterally beyond said well contact.

* * * * *